(12) United States Patent
Yu

(10) Patent No.: US 6,506,638 B1
(45) Date of Patent: Jan. 14, 2003

(54) VERTICAL DOUBLE GATE TRANSISTOR STRUCTURE

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/689,063

(22) Filed: Oct. 12, 2000

(51) Int. Cl.[7] ................................. H01L 21/00
(52) U.S. Cl. ................ 438/156; 438/157; 438/212; 257/302; 257/329; 257/401
(58) Field of Search ................ 257/302, 329, 257/401; 438/156, 157, 212

(56) References Cited

U.S. PATENT DOCUMENTS

| | | | |
|---|---|---|---|
| 4,532,534 A | | 7/1985 | Ford et al. |
| 5,705,409 A | * | 1/1998 | Witek ........................ 438/213 |
| 5,780,888 A | * | 7/1998 | Maeda et al. ............... 257/302 |
| 5,994,735 A | * | 11/1999 | Maeda et al. ............... 257/329 |
| 6,027,975 A | * | 2/2000 | Hergenrother et al. ...... 438/268 |
| 6,031,269 A | | 2/2000 | Liu |

OTHER PUBLICATIONS

"Ultra–Thin–Body Silicon–On–Insulator MOSFET's for Terabit–Scale Integration" by Yu, Department of Electrical Engineering and Computer Sciences, University of California Berkeley.

* cited by examiner

Primary Examiner—Trung Dang
(74) Attorney, Agent, or Firm—Foley & Lardner

(57) ABSTRACT

A method of manufacturing a vertical transistor. The vertical transistor utilizes a deposited amorphous silicon layer to form a source region. The vertical gate transistor includes a double gate structure for providing increased drive current. A wafer bonding technique can be utilized to form the substrate.

22 Claims, 2 Drawing Sheets

VERTICAL DOUBLE GATE TRANSISTOR STRUCTURE

FIELD OF THE INVENTION

The present invention relates generally to integrated circuits (ICs) and methods of manufacturing integrated circuits. More particularly, the present invention relates to a vertical transistor structure and a method of manufacturing integrated circuits having vertical transistors.

BACKGROUND OF THE INVENTION

Integrated circuits (ICs), such as, ultra-large-scale integrated (ULSI) circuits, can include as many as one million transistors or more. The ULSI circuit can include complementary metal oxide semiconductor (CMOS) field effect transistors (FETS). The transistors can include semiconductor gates adjacent a channel region and between drain and source regions. The drain and source regions are typically heavily doped with a P-type dopant (boron) or an N-type dopant (phosphorous).

Generally, conventional ICs have employed lateral transistors or devices. Lateral transistors include source and drain regions disposed below a top surface of a bulk or semiconductor-on-insulator (SOI) substrate and a gate disposed above the top surface. Thus, the source region, drain region, and gate of lateral transistors each consumes valuable space on the top surface of the substrate. The gate is disposed on only one side of a channel between the source and the drain. Accordingly, the conventional lateral device can have a limited drive current.

SOI-type devices generally completely surround a silicon or other semiconductor substrate with an insulator. Lateral devices built on SOI substrates have significant advantages over devices built on bulk-type substrates. The advantages include near ideal subthreshold voltage slope, low junction capacitance, and effective isolation between devices. These advantages lead to further advantages, including reduced chip size or increased chip density, because minimal device separation is needed due to the surrounding insulating layers. Additionally, SOI devices can operate at increased speeds due to reductions in parasitic capacitance.

As demands for integration (transistor density) increase, vertical transistors have been considered. Vertical transistors can be insulated gate field effect transistors (IGFETs), such as, MOSFETS. In a conventional vertical MOSFET, source and drain regions are provided on opposite surfaces (e.g., a top surface and a bottom surface) of a semiconductor layer and a body region is disposed between the source and drain regions. During MOSFET operation, current flows vertically between the source and drain regions through a channel within the body region. The channel is often described in terms of its length, i.e., the spacing between the source and drain regions at the semiconductor surface, and its width, i.e., the dimension perpendicular to the length. Channel width is typically far greater than channel length.

In one example of a conventional vertical FETs on a bulk-type substrate, the bulk-type semiconductor substrate, such as, a silicon substrate, is etched to form trenches or steps. The gate of the vertical transistor is disposed on a side wall of the trench or step, and the channel region is located adjacent to the side wall. Placing a gate conductor in the trench can be a difficult technical feat, especially as the size of gate lengths and gate widths decrease. Due to its small lateral size, the vertical transistor structure generally allows more devices to be contained on a single semiconductor substrate than the conventional lateral structure. Similar to the conventional lateral structure discussed above, the gate conductors of the vertical transistor are disposed on only one side of the channel region, and the current density associated with the vertical FET is accordingly somewhat limited.

As discussed above, vertical transistors offer significant advantages including small wafer surface area consumption due to the vertical nature of the transistor. The vertical nature allows three dimensional integration. In addition, the vertical transistor design is conductive to double gate and surrounded gate structures. Double gate and surrounded gate structures allow an electrical field to be induced in the channel region from two or more sides. Accordingly, the double gate and surrounded gate structures can increase current density and switching speeds. Further, the double gate and surrounded gate structures provide more scalability with respect to controlling short channel effects and can be used to control threshold voltages.

Thus, there is a need for an integrated circuit or electronic device that includes vertical transistors and can be manufactured in an efficient process. Further still, there is a need for vertical transistors having double gate or surrounded gate structures. Even further still, there is a need for a method of manufacturing vertical transistors without providing a gate conductor in a trench. Yet further, there is a need for a method of manufacturing double gate vertical transistors and surrounded gate vertical structures. Yet even further, there is a need for an efficient method of manufacturing a double gate vertical transistor.

SUMMARY OF THE INVENTION

The present invention relates to the method of manufacturing a vertical transistor. The method includes providing a semiconductor substrate including a semiconductor base layer which is below a first insulative layer which is below a semiconductor layer which is below a second insulative layer. The method also includes a providing an aperture through the first insulative layer, the semiconductor layer and the second insulative layer, doping the semiconductor substrate through the aperture, and providing an amorphous semiconductor layer above the second insulative layer and within the aperture.

The present invention further relates to a vertical transistor. The vertical transistor includes a first gate conductor disposed above a top surface of a substrate, a second gate conductor disposed above a top surface of a substrate, a source disposed at least partially below the top surface of the substrate, and a drain disposed entirely above the top surface of the substrate. The first gate conductor is located between two dielectric layers. The second gate conductor is also located between two dielectric layers. A channel region is disposed between the first gate conductor and the second gate conductor and between the drain and the source.

The present invention further relates to a process of forming a vertical transistor having a channel region above a top surface of a substrate. The process includes providing a first dielectric layer, a silicon layer and a second dielectric layer above a top surface of the substrate, providing an aperture in the first dielectric layer, the silicon layer, and the second dielectric layer, forming an amorphous semiconductor layer above the second dielectric layer and within the aperture, doping the amorphous semiconductor layer, and annealing the amorphous semiconductor layer.

BRIEF DESCRIPTION OF THE DRAWINGS

Exemplary embodiments will hereafter be described with reference to the accompanying drawings, wherein like numerals denote like elements, and.

DETAILED DESCRIPTION OF THE PREFERRED EMBODIMENTS

Figure 1:
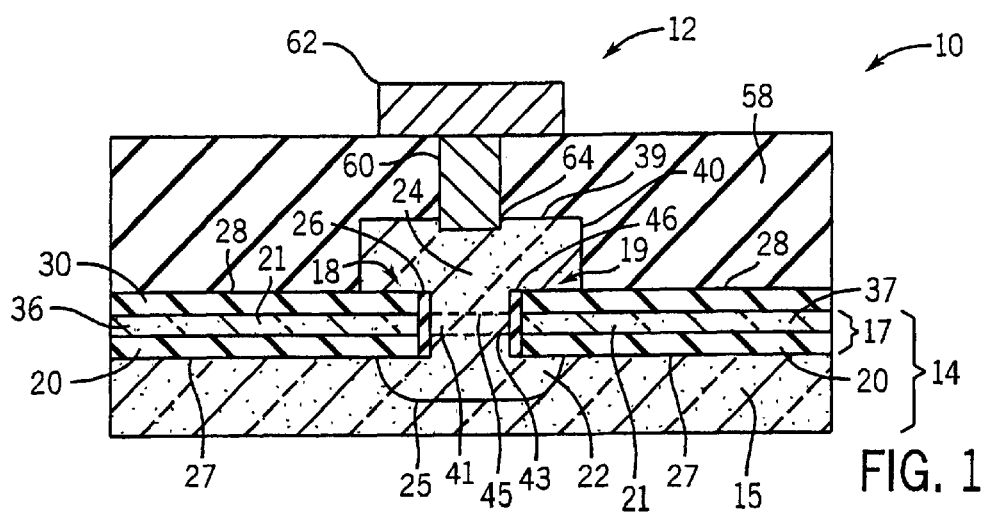
FIG. 1 is a cross-sectional view of a portion of an integrated circuit in accordance with an exemplary embodiment, the integrated circuit including a vertical transistor.

With reference to FIG. 1, a portion 10 of an integrated circuit (IC) includes a vertical transistor 12 which is disposed on a semiconductor substrate 14. Semiconductor substrate 14 is preferably a compound structure comprised of a semiconductor-on-insulator (SOI) substrate 17, silicon-on-glass and a bulk-type semiconductor base or substrate 15. Substrate 14 can be embodied as a wafer suitable for semiconductor fabrication.

Substrate 17 includes a semiconductor layer 21 and a dielectric or an insulative layer 20. Preferably, substrate 17 is a silicon-on-glass wafer including a single crystal silicon layer (layer 21) and a silicon dioxide layer (layer 20). Substrate 17 can be purchased from a number of sources or can be formed by various conventional techniques.

Alternatively, substrate 14 can be an N-type well in a P-type substrate, an insulative substrate, a bulk P-type single crystalline (001) silicon substrate, SOI substrate or other suitable material for transistor 12. For example, substrate 14 could be a bulk-type substrate 15 including deposited layers similar to the layers associated with substrate 17 formed by an epitaxy or deposition process.

A dielectric or insulative layer 30 is disposed above semiconductor layer 21 of substrate 17. A semiconductor layer 40 is disposed above insulative layer 30. Layer 30 and layer 40 are covered by a dielectric or insulative layer 58.

Transistor 12 can be a P-channel or N-channel vertical metal oxide semiconductor field effect transistor (MOSFET). Transistor 12 is preferably embodied as a fully depleted (FD), double gate vertical MOSFET and includes a gate structure 18, a gate structure 19, a source region 22, and a drain region 24. Gate structures 18 and 19 advantageously provide a double gate structure that provides increased drive current and high immunity to short channel effects. Gate structures 18 and 19 can also continue to cover a front and back side (into and above the page in FIG. 1) of portion 10 so that transistor 12 has gate conductors on four sides of a channel 41.

Source region 22 extends from a top surface 27 of substrate 15 to a bottom 25 in substrate 15. Top surface 27 is below layer 20 of substrate 17. Region 22 is preferably 800–2000 Å wide (left-to-right in FIG. 1) and 1700–4300 Å deep from top surface 27 to bottom 25. Drain region 24 extends from a top surface 39 of semiconductor layer 40 to a top surface 28 of insulative layer 30. Region 40 can be 0.2 to 0.5 microns wide (left-to-right in FIG. 1).

For an N-channel transistor, regions 22 and 24 are heavily doped with N-type dopants (e.g., $1 \times 10^{20}$–$5 \times 10^{20}$ dopants per cubic centimeter). For a P-channel transistor, regions 22 and 24 are heavily doped with P-type dopants (e.g., $1 \times 10^{20}$–$5 \times 10^{20}$ dopants per cubic centimeter). Appropriate dopants for a P-channel transistor include boron, boron diflouride, or iridium, and appropriate dopants for an N-channel transistor include arsenic, phosphorous, or antimony.

Gate structure 18 includes a gate conductor 36 (layer 21 of substrate 17). Gate structure 18 can also include a spacer 26. Gate structure 19 includes a gate conductor 37 (layer 21 of substrate 17). Gate structure 19 can also include a spacer 46. Conductors 36 and 37 are preferably a doped silicon material and can be electrically coupled together or electrically isolated. Conductors 36 and 37 can be a 200–1000 Å thick single crystal silicon material.

Layer 21 (conductors 36 and 37) are preferably surrounded by insulative layers 20 and 30. Layers 20 and 30 are preferably comprised of a thermally grown, 150–300 Å thick silicon dioxide material. Alternatively, deposited silicon dioxide (tetraethylorthosilicate (TEOS)), silicon nitride ($Si_3N_4$) material or low-K dielectric materials can be utilized as layers 20 and 30. Alternatively, conductors 36 and 37 can include metal, such as a refractory metal. Conductors 36 and 37 can also include polysilicon. In another alternative, conductors 36 and 37 can include germanium to adjust the work function associated with transistor 12. Conductors 36 and 37 can be identically doped or can be separately doped depending upon desired operational parameters for transistor 12.

Conductors 36 and 37 and layers 20 and 30 are preferably etched to form the particular structure for transistor 12. Conductors 36 and 37 can be a variety of lengths and geometries depending on the design of portion 10.

Drain region 24 is preferably thicker and wider than channel 41 that is disposed along a vertical axis between regions 22 and 24. Channel 41 is disposed along a horizontal axis between gate structures 18 and 19.

Source region 22 extends approximately 150–250 Å above top surface 28 to a junction 43 of region 41, and drain region 24 extends approximately 150–250 Å from top surface 28 to a junction 45 of region 41.

Preferably, channel 41 is approximately 60–280 Å wide (left-to-right) if spacers 26 and 46 are utilized. Channel 41 is approximately 200–1000 Å deep from junction 43 to junction 41. Channel 41 can be doped in a variety of fashions to control short channel effects and to ensure the appropriate operation of transistor 12. Preferably, channel 41 is undoped.

Spacers 26 and 46 can be a silicon nitride material formed in a conventional deposition and etch back process. Alternatively, other insulative materials can be utilized for spacers 26 and 46, such as, low k dielectric materials. Preferably, spacers 26 and 46 are of a different material than layers 20 and 30 to protect layer 21 (conductors 36 and 37) during subsequent processing steps such as etching and deposition steps.

Drain region 24 and insulative layer 30 are preferably covered by dielectric layer 58. Dielectric layer 58 is preferably a 2000–5000 Å thick layer of insulative material, such as, silicon dioxide. Alternatively, compound or composite layers can be utilized for layer 58.

Drain region 24 is coupled through a conductive via or contact 60 to a metal pad 62. Contact 60 extends from pad 62 through layer 58 to layer 24. Contact 60 can be a silicide material, a tungsten material, or other conductive material. Preferably, a junction 64 between region 24 and contact 60 includes a silicide material. Conventional silicidation techniques can be utilized for the silicide portion at junction 64. For example, titanium silicide, cobalt silicide, tungsten silicide, and other silicides can be utilized.

With reference to FIGS. 1–8, the fabrication of transistor 12 is described as follows. The advantageous process allows a double gate or surrounded gate vertical transistor structure to be formed. Transistor 12 can be advantageously fabricated without depositing a gate conductor in a trench.

Figure 2:
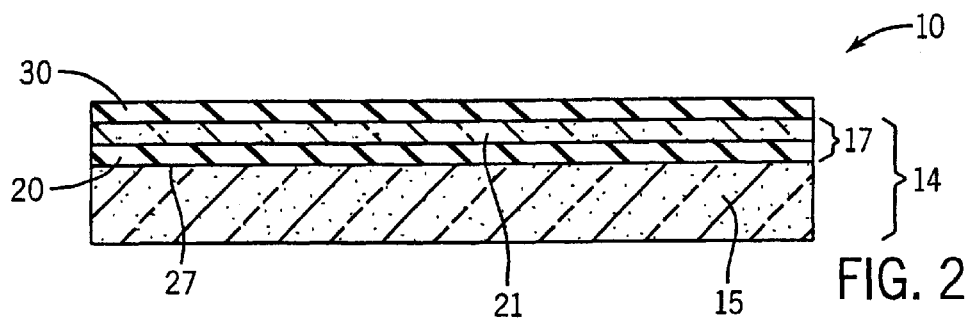
FIG. 2 is a cross-sectional view of the portion of the integrated circuit illustrated in FIG. 1, showing a compound substrate for the integrated circuit.

In FIG. 2, substrate 14 is provided. Preferably, substrate 14 is comprised of bulk semiconductor substrate 15 and SOI substrate 17. Layer 20 of substrate 17 is preferably a 150–250 Å thick silicon dioxide layer. Layer 21 of substrate 17 is preferably a 200–1000 Å undoped single crystal silicon layer. Preferably, substrate 15 is a 300–1000 micrometer thick single crystal undoped bulk silicon substrate.

Substrate 15 is attached to substrate 17 by a wafer bonding technique. Alternatively, other methods of attaching substrate 15 to substrate 17 can be utilized. Substrate 15 is disposed below substrate 17 and layer 20 is attached to top surface 27 of substrate 15. Wafer bonding can be completed at room temperature and in a nitrogen ($N_2$) ambient atmosphere. Alternatively, higher temperature techniques can be utilized. In one embodiment, Smart-Cut® and Unibond® techniques can be utilized to bond substrate 17 to substrate 15. Smart-Cut® and Unibond® techniques are discussed in "Smart-Cut®: The Basic Fabrication Process for UNIBOND® SOI Wafers," by Auberton-Herue, Bruel, Aspar, Maleville, and Moriceau (IEEE TRANS ELECTRON, March 1997), incorporated herein by reference. The Smart-Cut® and Unibond® techniques can reach temperatures of 110° C. to bond substrate 17 to substrate 15.

The Smart-Cut® and UNIBOND® techniques utilize a combination of hydrogen implantation and wafer bonding to form substrate 14. Substrates 15 and 17 can be cleaned utilizing a modified RCA cleaning and are bonded in hydrophilic conditions. The silicon substrate (substrate 15) includes native oxide which, similar to the insulating layer forms OH-terminated surfaces after cleaning. Interactions between water absorbed on the surfaces causes the wafers to be bonded. Thermal treatments stabilize the bonding interface.

Either before or after substrate 17 is bonded to substrate 15, insulative layer 30 deposited above layer 21. Preferably, layer 30 is a TEOS deposited silicon dioxide layer which is approximately 150–250 Å thick. Preferably, layer 30 is the same material as layer 20 and is deposited after substrate 17 is attached to substrate 15.

Figure 3:
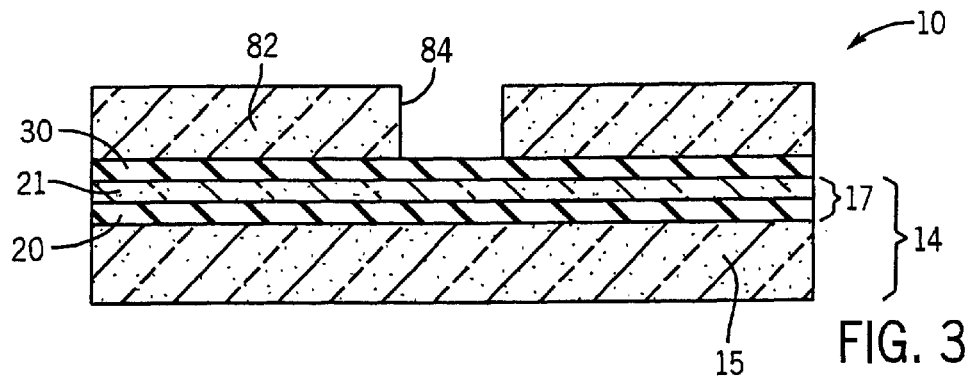
FIG. 3 is a cross-sectional view of the portion of the integrated circuit illustrated in FIG. 2, showing a first photolithographic step.

In FIG. 3, a photoresist material 82 is provided above layer 30. A conventional photolithographic process is utilized to provide a window 84 in material 82. Preferably, window 84 is 100–300 Å wide and defines channel 41 (FIG. 1).

Figure 4:
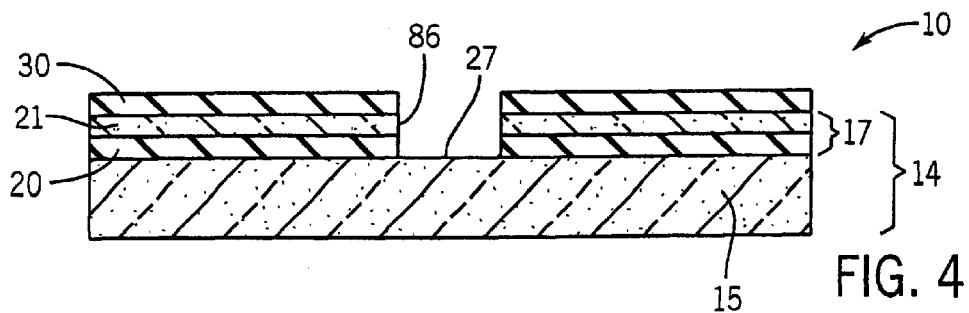
FIG. 4 is a cross-sectional view of the portion of the integrated circuit illustrated in FIG. 3, showing an etching step.

In FIG. 4, layers 30, 21, and 20 are etched in dry etching processes in accordance with window 84 (FIG. 3). Preferably, an aperture 86 is provided in substrate 17 due to the etching process. Aperture 86 extends to top surface 27 of substrate 15. Aperture 86 separates gate conductors 36 and 37 (FIG. 1).

Figure 5:
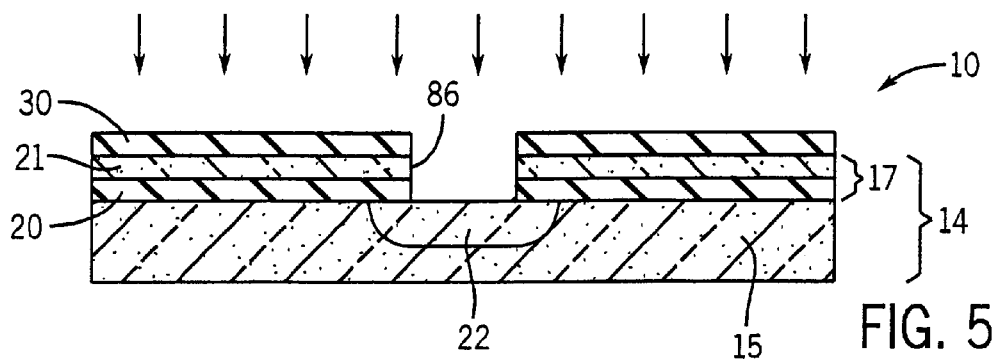
FIG. 5 is a cross-sectional view of the portion of the integrated circuit illustrated in FIG. 4, showing a first dopant implant step.

In FIG. 5, substrate 15 is subjected to a dopant implant to form source region 22. Preferably, phosphorous or arsenic ions are utilized to implant source region 22 through aperture 86. Conventional doping techniques can be utilized to form region 22. Substrate 17 and layer 30 prevent substrate 15 from being doped in areas outside of aperture 86. Thus, aperture 86 advantageously defines both channel 41 (FIG. 1) and source region 22.

Figure 6:
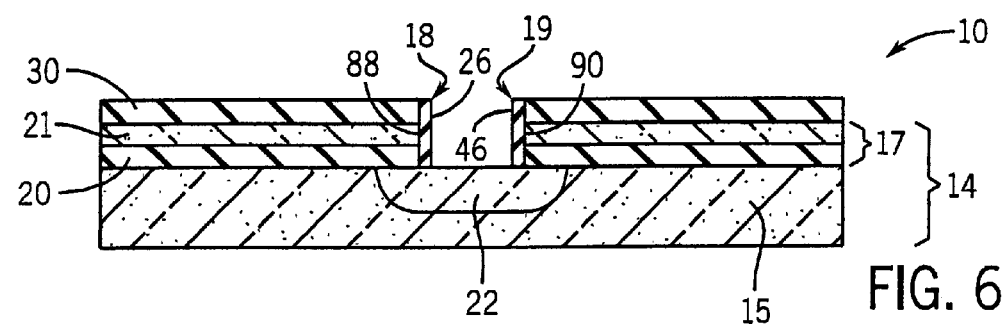
FIG. 6 is a cross-sectional view of the portion of the integrated circuit illustrated in FIG. 5, showing a spacer formation step.

In FIG. 6, low pressure chemical vapor deposition (LPCVD) is utilized to form nitride liners or spacers 26 and 46 on sidewalls 88 and 90 of layers 20, 21, and 30. Spacer 26 is associated with gate structure 18, and spacer 40 is associated with gate structure 19. After deposition, the nitride material is etched to leave spacers 26 and 46. Spacers 26 and 46 are preferably each 15–30 Å wide and 1000–3000 Å high (the total thickness of layers 20, 21, and 30). Thus, aperture 86 also defines the placement of gate structures 18 and 19 with respect to channel 41 (FIG. 1).

Figure 7:
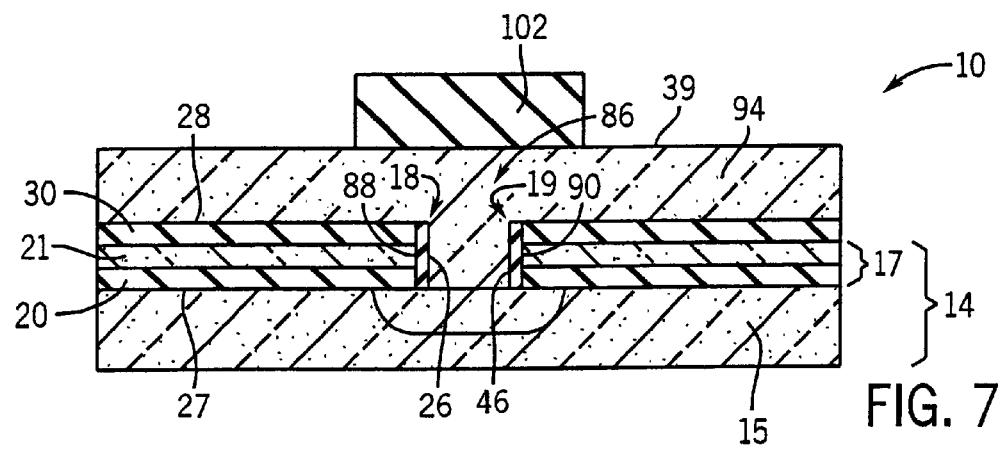
FIG. 7 is a cross-sectional view of the portion of the integrated circuit illustrated in FIG. 6, showing a semiconductor deposition step and a second photolithographic step.

In FIG. 7, after gate structures 18 and 19 are completed, a semiconductor layer 94 is deposited above layer 30 and within aperture 86. Preferably, layer 94 is a conformal amorphous semiconductor material and fills aperture 86 between spacers 26 and 46. In aperture 86, layer 94 is in contact with top surface 27 of substrate 15. Layer 94 is preferably an amorphous silicon layer and is approximately 500–1000 Å thick from the top surface 28 of layer 30 to a top surface 39.

After layer 94 is deposited, a photoresist material is provided and configured by photolithography to leave an island or a mask 102 above layer 94. Preferably, mask 102 is wider than channel region 41 and is 2000–10,000 Å wide. After mask 102 is formed, layer 94 is etched in a plasma dry etching process. Mask 102 is preferably centered about aperture 86. After etching, layer 94 is preferably a rectangular or square structure 0.5 to 0.2 microns wide.

Figure 8:
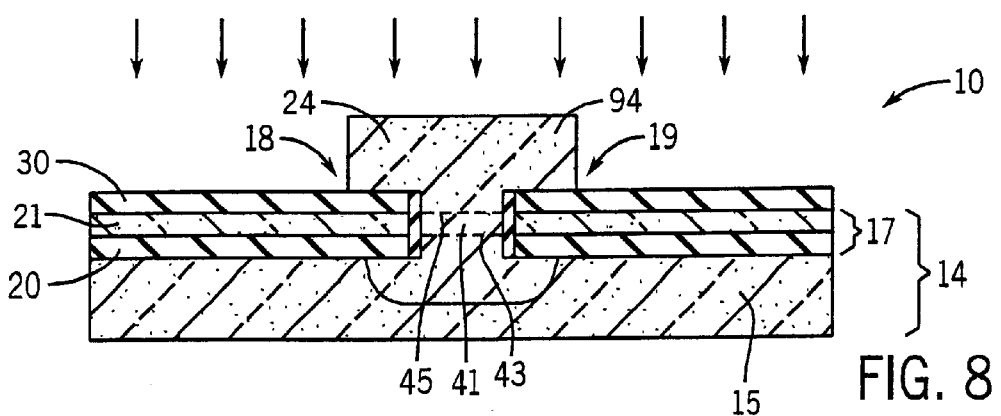
FIG. 8 is a cross-sectional view of the portion of the integrated circuit illustrated in FIG. 7, showing a second dopant implant step.

In FIG. 8, mask 102 is removed and a dopant implant is provided to layer 94. Preferably, the implant depth is shallow enough to prevent the dopant implant from entering substrate 15 through substrate 17. Preferably, the dopant implant provides dopants for a drain region 24 having a concentration of dopants of $1\times10^{20}$ to $5\times10^{20}$ dopant per cubic centimeter. Preferably, the implant is centered so that drain region 24 has a junction 45 at a location even with a top surface of layer 21 after annealing.

After implantation, substrate 14 is subjected to a thermal anneal to activate dopants in layer 94 and substrate 15. Channel 41 is left between junctions 43 and 45. After annealing, the amorphous material of layer 94 becomes recrystallized. Dopants associated with region 22 can migrate to the location of junction 43 (the bottom surface layer 21) after annealing. Thus, the thermal anneal causes junctions 43 and 45 to be close to the top and bottom location of gate conductors 36 and 37.

After annealing, layer 58 is deposited and contact 60 is formed. Pad 62 can also be formed above layer 58 by a deposition and selective etching process. Other conventional CMOS processes can form other components for portion 10. For example, metal layers and other contacts can be utilized to connect elements of transistor 12.

The double gate structure (gate structures 18 and 19) can be utilized in various fashions. For example, gate conductors 36 and 37 can be coupled together to provide greater drive current for transistor 12. Alternatively, bias on one or both of gate conductors 36 and 37 can be adjusted to adjust the threshold voltage associated with transistor 12. In yet another alternative, conductors 36 and 37 can be maintained separately for providing different control to transistor 12.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of gate conductors are described, other materials can be utilized. Other sizes and thickness for the structure described are possible, especially in light of changing capabilities of fabrication equipment and processes. Various changes may be made to the details disclosed without departing from the spirit of the invention which is defined by the following claims.

What is claimed is:

1. A method of manufacturing a vertical transistor, the method comprising:
   providing a semiconductor substrate including a semiconductor base layer below a first insulative layer, the first insulative layer being below a first semiconductor layer, and the first semiconductor layer being below a second insulative layer;
   providing an aperture through the first insulative layer, the first semiconductor layer, and the second insulative layer;
   doping the semiconductor substrate through the aperture; and
   providing an amorphous semiconductor layer above the second insulative layer and within the aperture.

2. The method of claim 1, further comprising:
   doping the amorphous semiconductor layer.

3. The method of claim 2, further comprising annealing the amorphous semiconductor layer.

4. The method of claim 3, further comprising etching the amorphous semiconductor layer before the annealing step.

5. The method of claim 4, wherein the amorphous semiconductor layer is etched to have a width between 500–2000Å.

6. The method of claim 1, further comprising:
   before the providing an amorphous semiconductor layer step, providing dielectric spacers on side walls of the aperture.

7. The method of claim 6, wherein the dielectric spacers are silicon nitride.

8. The method of claim 1, wherein the aperture divides the first semiconductor layer into a first portion including a first gate conductor on a first side of the aperture and a second portion including a second gate conductor on the other side of the aperture.

9. The method of claim 1, wherein the semiconductor substrate includes single crystalline silicon.

10. The method of claim 1, wherein a channel region is located between the first insulative layer and the second insulative layer in the aperture.

11. A vertical transistor, comprising:
    a first gate conductor disposed above a top surface of a substrate;
    a second gate conductor disposed above the top surface of the substrate, wherein the first gate conductor is located between two dielectric layers, wherein the second gate conductor is located between two dielectric layers;
    a source disposed at least below partially above the top surface of the substrate;
    a drain disposed entirely above the top surface of the substrate; and
    a channel region between the first gate conductor and the second gate conductor and between the drain and the source, the channel region being at least partially above the top surface of the substrate, wherein a first spacer is silicon nitride provided on a side wall of the first gate conductor, and wherein the channel region is a 90–280 Å wide.

12. The transistor of claim 11, wherein the channel region is 90–280 Å wide.

13. The transistor of claim 11, wherein the channel region is 500–1000 Å long.

14. The transistor of claim 12, wherein the channel region is 90–280 Å wide.

15. A vertical transistor, comprising:
    a first gate conductor disposed above a top surface of a substrate;
    a second gate conductor disposed above the top surface of the substrate, wherein the first gate conductor is located between two dielectric layers, wherein the second gate conductor is located between two dielectric layers;
    a source disposed at least below partially above the top surface of the substrate;
    a drain disposed entirely above the top surface of the substrate; and
    a channel region between the first gate conductor and the second gate conductor and between the drain and the source, the channel region being at least partially above the top surface of the substrate, wherein a first spacer is disposed between the channel region and the first gate conductor and a second spacer is disposed between the channel region and the second gate conductor, wherein the channel region is 500–1000 Å long.

16. A vertical transistor, comprising:
    a first gate conductor disposed above a top surface of a substrate;
    a second gate conductor disposed above the top surface of the substrate, wherein the first gate conductor is located between a first pair of dielectric layers, wherein the second gate conductor is located between a second pair of dielectric layers;
    a source disposed at least below partially above the top surface of a the substrate;
    a drain disposed entirely above the top surface of the substrate; and
    a channel region between the first gate conductor and the second gate conductor and between the drain and the source, the channel region being at least partially above the top surface of the substrate, wherein a first spacer is disposed between the channel region and the first gate conductor and a second spacer is disposed between the channel region and the second gate conductor, wherein the dielectric layers of the first pair and the second pair are each 50–250 Å thick.

17. A process of forming a vertical transistor having a channel region at least partially above a top surface of a substrate, the process comprising:
    providing a first dielectric layer, a silicon layer and second dielectric layer above a top surface of the substrate;
    providing an aperture in the first dielectric layer, the silicon layer and the second dielectric layer;
    doping the substrate through the aperture;
    forming a semiconductor layer above the second dielectric layer and within the aperture;
    doping the semiconductor layer; and
    annealing the semiconductor layer.

18. The process of claim 17, wherein the silicon layer includes a first portion being a first gate conductor and a second portion being a second gate conductor.

19. The process of claim 18, wherein the aperture is 90–280 Å wide.

20. The process of claim 19, wherein the semiconductor layer includes amorphous silicon.

21. A process of forming a vertical transistor having a channel region at least partially above a top surface of a substrate, the process comprising steps of;
   a) providing a first dielectric layer, a first semiconductor layer and a second dielectric layer above a top surface of the substrate;
   b) providing an aperture in the first dielectric layer, the first semiconductor layer and the second dielectric layer, the aperture reaching the substrate at a location;
   c) providing a doped region located at the location;
   d) forming a second semiconductor layer above the second dielectric layer and within the aperture;
   e) doping the second semiconductor layer; and
   f) annealing the second semiconductor layer, wherein step (b) is performed before step (c).

22. A vertical transistor, comprising;

a first doped source/drain region in a substrate;

a channel region disposed above the first doped source/drain region, the channel region having a bottom above the first doped source/drain region, a first side, and a second side, the channel region being 90–280 Å wide and 500–100 Å long;

a first gate conductor isolated from the substrate and above the a substrate, the first gate conductor being adjacent a first dielectric structure including silicon nitride on the first side of the channel region;

a second gate conductor isolated from the substrate and above the substrate, the second gate conductor being adjacent a second dielectric structure including silicon nitride on the second side of the channel region; and a second source/drain region disposed entirely above the substrate and disposed above the channel region and the first gate conductor and the second gate conductor.

* * * * *

UNITED STATES PATENT AND TRADEMARK OFFICE
CERTIFICATE OF CORRECTION

PATENT NO. : 6,506,638 B1
DATED : January 14, 2003
INVENTOR(S) : Bin Yu

It is certified that error appears in the above-identified patent and that said Letters Patent is hereby corrected as shown below:

Column 8,
Line 8, delete "11" and insert therefor -- 15 --.
Line 12, delete "12" and insert therefor -- 16 --.
Line 42, delete "a" before "the".
Line 53, delete "50-250" and insert therefor -- 150-250 --.

Column 9,
Line 10, delete ";" and insert therefor -- : --.

Column 10,
Line 1, delete ";" and insert therefor -- : --.
Line 7, delete "500-100" and insert therefor -- 500-1000 --.
Line 9, delete "a" after "the"

Signed and Sealed this

First Day of July, 2003

JAMES E. ROGAN
*Director of the United States Patent and Trademark Office*